US008080809B2

(12) United States Patent
Abe

(10) Patent No.: US 8,080,809 B2
(45) Date of Patent: Dec. 20, 2011

(54) CHARGED PARTICLE BEAM WRITING APPARATUS AND METHOD THEREOF

(75) Inventor: Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 334 days.

(21) Appl. No.: 12/168,361

(22) Filed: Jul. 7, 2008

(65) Prior Publication Data

US 2009/0008568 A1 Jan. 8, 2009

(30) Foreign Application Priority Data

Jul. 6, 2007 (JP) ................................. 2007-178175

(51) Int. Cl.
*H01J 3/14* (2006.01)
(52) U.S. Cl. ............. 250/396 R; 250/492.2; 250/492.22
(58) Field of Classification Search ............... 250/396 R
See application file for complete search history.

(56) References Cited

U.S. PATENT DOCUMENTS 5,168,166 A * 12/1992 Hayakawa et al. ........ 250/492.2
5,422,491 A * 6/1995 Sakamoto ................ 250/492.22
6,177,680 B1 * 1/2001 Dick et al. ............... 250/492.22

FOREIGN PATENT DOCUMENTS
JP 3197024 6/2001
* cited by examiner

*Primary Examiner* — Phillip A Johnston
(74) *Attorney, Agent, or Firm* — Oblon, Spivak, McClelland, Maier & Neustadt, L.L.P.

(57) ABSTRACT

A charged particle beam writing apparatus includes a unit emitting a charged particle beam, a stage on which a target workpiece to be written is placed, a unit correcting a reference position of a small region in a writing region, based on a pattern distortion obtained from positions of figures spread over substantially all writing region of a dummy target workpiece and written without correcting, a first deflector deflecting the beam, based on a corrected reference position obtained by correcting the reference position, a correction unit correcting a relative distance from the corrected reference position to an arbitrary position in the small region, based on a pattern distortion of the dummy, by using the reference position and a coefficient of a correction equation for correcting the reference position, and a second deflector further deflecting the beam from a position deflected by the first deflector, based on the relative distance corrected.

4 Claims, 7 Drawing Sheets

Related Art

Related Art

図7A

CHARGED PARTICLE BEAM WRITING APPARATUS AND METHOD THEREOF

CROSS-REFERENCE TO RELATED APPLICATION

This application is based upon and claims the benefit of priority from the prior Japanese Patent Application No. 2007-178175 filed on Jul. 6, 2007 in Japan, the entire contents of which are incorporated herein by reference.

BACKGROUND OF THE INVENTION

1. Field of the Invention

The present invention relates to a charged particle beam writing apparatus and a charged particle beam writing method, and for example, relates to a writing apparatus that corrects distortion produced in a subfield (SF) and a method therefor.

2. Description of Related Arts

A lithography technique that advances microminiaturization of semiconductor devices is an extremely important process only which forms patterns in semiconductor manufacturing processes. In recent years, with high integration of large-scale integrated circuits (LSI), a circuit critical dimension required for semiconductor devices becomes minuter year by year. In order to form a desired circuit pattern on semiconductor devices, there is required a master pattern (also called a mask or a reticle) of high precision. The electron beam writing technique intrinsically has excellent resolution and is used for manufacturing a highly precise master pattern.

FIG. 6 shows a schematic diagram for describing operations of a variable-shaped type electron beam (EB) writing apparatus. As shown in the figure, the variable-shaped electron beam writing apparatus includes two aperture plates and operates as follows: A first or "upper" aperture plate 410 has a rectangular opening or "hole" 411 for shaping an electron beam 330. This shape of the rectangular opening may also be a square, a rhombus, a rhomboid, etc. A second or "lower" aperture plate 420 has a variable-shaped opening 421 for shaping the electron beam 330 that passed through the opening 411 into a desired rectangular shape. The electron beam 330 being emitted from a charged particle source 430 and having passed through the opening 411 is deflected by a deflector to penetrate a part of the variable-shaped opening 421 and thereby to irradiate a target workpiece or "sample" 340 mounted on a stage continuously moving in one predetermined direction (e.g. x direction) during the writing or "drawing". In other words, a rectangular shape capable of passing through both the opening 411 and the variable-shaped opening 421 is written in the writing region of the target workpiece 340 on the stage. This method of writing or "forming" a given shape by letting beams pass through both the opening 411 and the variable-shaped opening 421 is referred to as a "variable shaping" method.

In the electron beam pattern writing apparatus, there exist some factors which degrade the accuracy of the position of a pattern. For example, such factors are position accuracy degradation generated in the electron optical system, inclination or distortion of a mirror which is set at the stage to measure the stage position, and flexure or distortion of a mask serving as a target workpiece. In particular, inclination or distortion of the mirror, or flexure or distortion of the mask changes gradually over the whole mask surface. Therefore, a gradual position error (global position error) arises over the whole mask surface because of the distortion or flexure. In electron beam pattern writing apparatuses, a writing region is divided into small regions (SF: subfield), and then writing is performed for each SF. Conventionally, the global position error mentioned above is corrected by correcting a reference position of an SF when writing (e.g., refer to Japanese Patent No. 3197024).

Furthermore, when exposing a pattern of a mask onto a silicon wafer by using an exposure apparatus and the mask which is written by the electron beam pattern writing apparatus, distortion occurs in setting the mask in the exposure apparatus. For example, in an exposure/transfer apparatus using EUV (Extreme UltraViolet) lights, which is studied in recent years, distortion occurs in the mask when fixing the mask by an electrostatic chuck. Then, it is necessary to correct the distortion in advance on the mask. Hereinafter, a distorted state in the electron beam writing apparatus and distortion produced in the exposure/transfer apparatus will be called "distortion", and correcting the distortion will be called a "distortion correction."

FIGS. 7A and 7B show schematic diagrams for explaining a conventional distortion correction. When distortion or flexure occurs in a writing region 20 as shown in FIG. 7A, the position of a center 24 of an SF 22 is corrected so that it may be located on a straight line as shown in FIG. 7B after writing. FIG. 7B shows an example of position relation after the correction. That is, only the coordinates of the center 24 of each SF 22 are corrected without correcting the distortion of the SF 22 itself. In this case, a part of SFs, namely the SFs 22a to 22d and the centers 24a to 24d of them, are shown. According to this method, however, the correction is equally added to the shot position in the SF 22. Therefore, there is a problem that errors resulting from the distortion or flexure in the SF still remain after writing as shown in FIG. 7B. Thus, it has been impossible to perform a sufficiently precise correction.

In recent years, with the miniaturization of patterns, it is requested to highly accurately correct errors caused by the distortion or flexure in the SF. Accordingly, there exists a problem that to correct only the SF position as mentioned above is insufficient as correction precision.

BRIEF SUMMARY OF THE INVENTION

An object of the present invention is to provide a writing apparatus which corrects global position errors highly accurately and a method therefor.

In accordance with one aspect of the present invention, a charged particle beam writing apparatus includes an emitting unit configured to emit a charged particle beam, a stage on which a target workpiece to be written is placed, a first correction unit configured to correct a reference position of a small region in a writing region of the target workpiece to be written, based on a pattern distortion obtained from positions of a plurality of figures spread over substantially all writing region of a dummy target workpiece and written without correcting, a first deflector configured to deflect the charged particle beam, based on a corrected reference position obtained by correcting the reference position, a second correction unit configured to correct a relative distance from the corrected reference position to an arbitrary position in the small region, based on a pattern distortion of the dummy target workpiece, by using the reference position and a coefficient of a correction equation for correcting the reference position, and a second deflector configured to further deflect the charged particle beam from a position deflected by the first deflector, based on the relative distance corrected.

In accordance with another aspect of the present invention, a charged particle beam writing method for writing a predetermined pattern on a target workpiece by deflecting a charged particle beam by using a main deflector and a sub deflector includes correcting a reference position of a small region, to be deflected by the main deflector, in a writing region of the target workpiece to be written, based on a pattern distortion obtained from positions of a plurality of figures spread over substantially all writing region of a dummy target workpiece and written without correcting, and correcting a relative distance, to be deflected by the sub deflector, from a corrected reference position obtained by correcting the reference position to an arbitrary position in the small region, by using the reference position and a coefficient of a correction equation for correcting the reference position, based on the pattern distortion of the dummy target workpiece.

DETAILED DESCRIPTION OF THE INVENTION

Embodiment 1

There will be described a structure for performing a distortion correction at an arbitrary position in an SF, in the following Embodiment. Moreover, a structure utilizing an electron beam as an example of a charged particle beam will also be described. The charged particle beam is not limited to the electron beam, and may be a beam using other charged particle, such as an ion beam.

Figure 1:
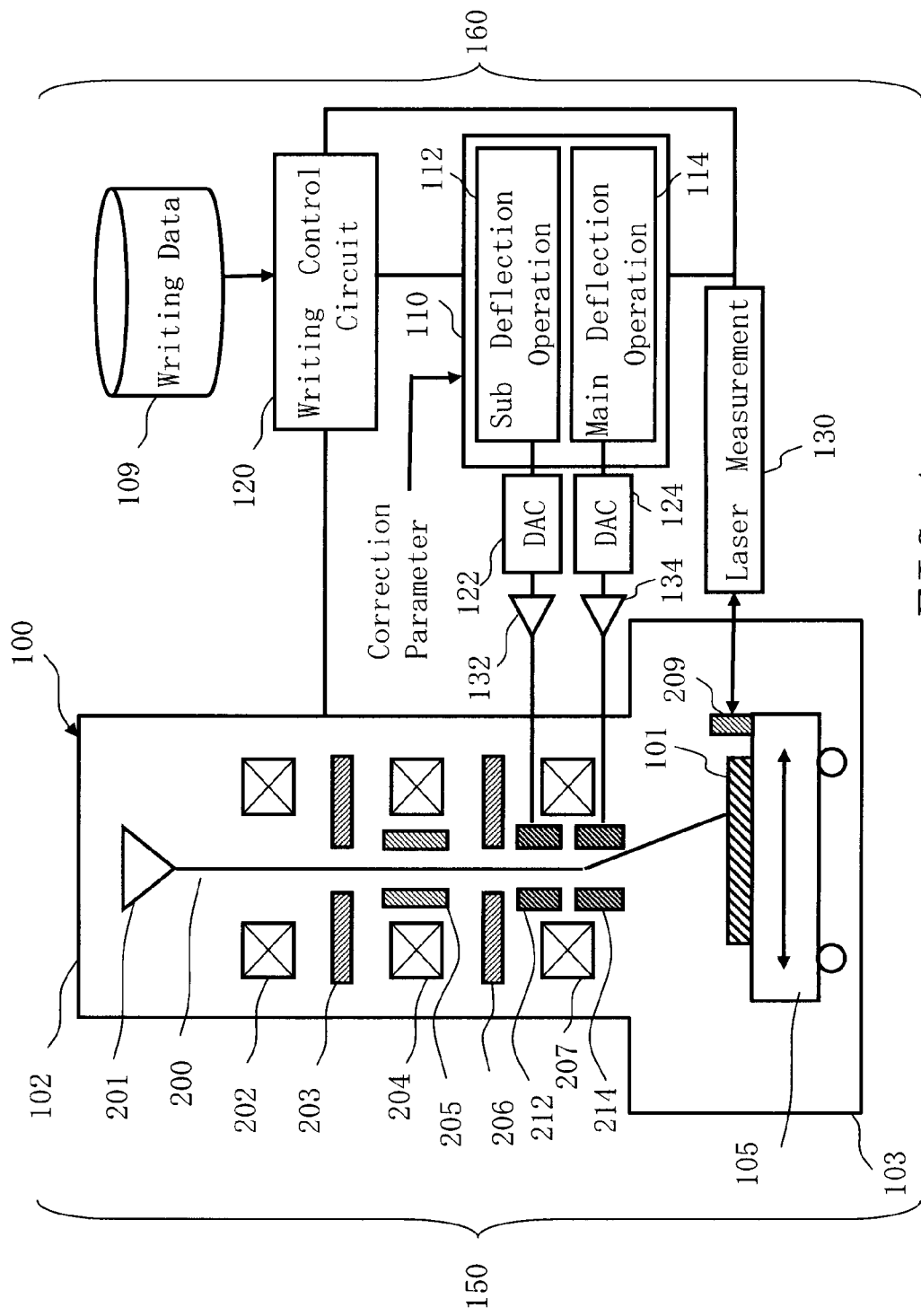
FIG. 1 is a schematic diagram showing a structure of a writing apparatus according to Embodiment 1.

FIG. 1 is a schematic diagram showing a structure of a writing apparatus described in Embodiment 1. In FIG. 1, a pattern writing apparatus 100 includes a writing unit 150 and a control unit 160. The pattern writing apparatus 100 serves as an example of a charged particle beam writing apparatus. The pattern writing apparatus 100 writes a desired pattern onto a target workpiece 101. The control unit 160 includes a writing control circuit 120, a laser measuring system 130, a magnetic disk device 109, a deflection control circuit 110, digital analog converters (DAC) 122 and 124, and amplifiers 132 and 134. The writing unit 150 includes an electron lens barrel 102 and a writing chamber 103. In the electron lens barrel 102, there are arranged an electron gun assembly 201, an illumination lens 202, a first aperture plate 203, a projection lens 204, a forming deflector 205, a second aperture plate 206, an objective lens 207, a sub deflector 212 and a main deflector 214. In the writing chamber 103, there is an XY stage 105 which is movably arranged. On the XY stage 105, there is placed a reflective mirror 209. Moreover, on the XY stage 105, the target workpiece 101 is laid, for example, by a three-point support. As the target workpiece 101, for example, an exposure mask for exposing or "transferring and printing" a pattern onto a wafer is included. This mask includes a mask blank where no patterns are formed, for example. Moreover, writing data is stored in the magnetic disk device 109. In the deflection control circuit 110, a sub deflection operating unit 112 and a main deflection operating unit 114 are arranged. Moreover, the writing control circuit 120 controls the writing unit 150 and the deflection control circuit 110. In particular, the sub deflector 212 and the main deflector 214 are controlled through the deflection control circuit 110. While only the structure elements necessary for explaining Embodiment 1 are shown in FIG. 1, it should be understood that other structure elements generally necessary for the pattern writing apparatus 100 are also included.

Moreover, the sub deflection operating unit 112 and the main deflection operating unit 114 may be executed by hardware, such as an electric circuit. Alternatively, processing of the function may be executed by the sub deflection operating unit 112 serving as a computer. Furthermore, it may be executed by a combination between hardware of an electric circuit and software, or a combination of hardware and firmware. Similarly, processing of the function may be executed by the main deflection operating unit 114 serving as a computer. Furthermore, it may be executed by a combination between hardware of an electric circuit and software, or a combination of hardware and firmware.

An electron beam 200 emitted from the electron gun assembly 201, being an example of an emitting unit, irradiates the whole of the first aperture plate 203 having a rectangular opening by using the illumination lens 202. The electron beam 200 is shaped to be a rectangle. Then, after having passed through the first aperture plate 203, the electron beam 200 of a first aperture image is projected onto the second aperture plate 206 by the projection lens 204. The position of the first aperture image on the second aperture plate 206 is controlled by the forming deflector 205, and thereby the shape and size of the beam can be changed. That is, the electron beam 200 is formed. After having passed through the second aperture plate 206, the electron beam 200 of a second aperture image is focused by the objective lens 207 and deflected by the main deflector 214 and the sub deflector 212 which are controlled by the deflection control circuit 110 to reach a desired position on the target workpiece 101 placed on the XY stage 105 which moves continuously. Then, the main deflector 214 deflects the electron beam 200 to a reference position, for example, the center position, of the SF in which the figure to be written is included. The sub deflector 212 deflects the beam from the reference position of the SF to a figure position. The laser measuring system 130 serving as an example of a measuring unit irradiates the reflective mirror 209 with a laser light, and receives a light reflected from the reflective mirror 209. By using the irradiation light and the reflection light, the position of the XY stage 105 can be measured.

However, if distortion has occurred in the reflective mirror 209, an error of the position to be measured is produced by the amount of the distortion. The reflective mirror 209 is longer than the target workpiece 101, with respect to along the target workpiece 101 and its writing region. The distortion changes gradually over the reflective mirror 209 in many cases. Therefore, the whole writing region is affected by the distortion. Moreover, in the case of the target workpiece 101 to be written is a mask for EUV (Extreme Ultra Violet), flexure of the mask also becomes a factor of the error. Since the EUV light, classified into a soft-X-ray region, is absorbed by many objects, it is impossible to form a projection optical system any longer. Therefore, as to an exposure method using the EUV light, a catoptric system is proposed. Therefore, a method of chucking the surface of the reverse side of the mask has been tried, not the conventional method of supporting the mask at three points or four points for letting a transmission light pass. For fixing the mask for the EUV, an electrostatic chuck is used, for example. That is, the mask for EUV is supported at the three or four points when being written, and its surface of the reverse side is chucked when being exposed. Therefore, the flexure of the mask at the time of being supported at the three or four points when being written is a factor of the error. In this Embodiment 1, the error caused by the distortion of the reflective mirror 209 or the flexure of the target workpiece 101 is corrected at an arbitrary position in the SF.

Figure 2:
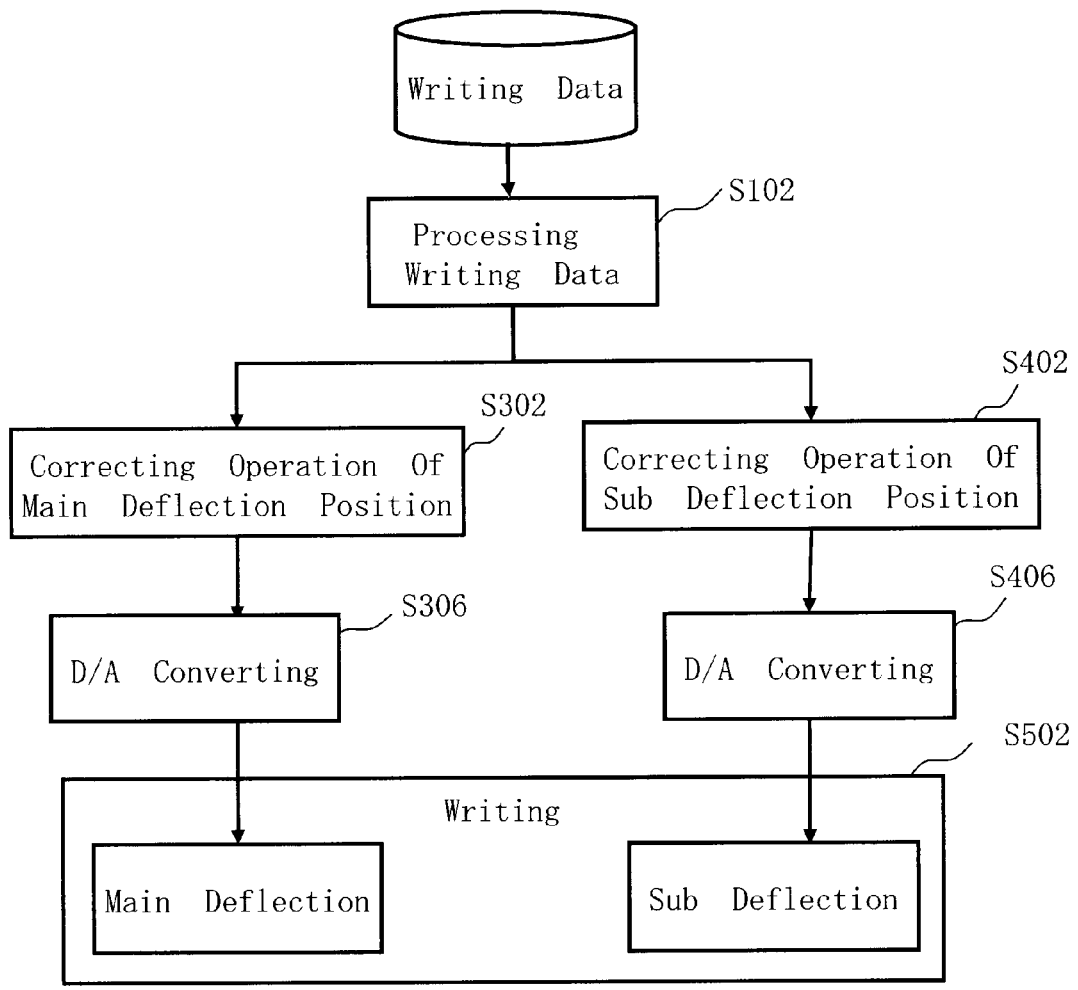
FIG. 2 is a flowchart showing main steps of a writing method according to Embodiment 1.

FIG. 2 is a flowchart showing main steps of a writing method described in Embodiment 1. In FIG. 2, the writing method according to Embodiment 1 executes a series of steps: a writing data processing step (S102), a main deflection position correcting operation step (S302), a D/A conversion step (S306), a sub deflection position correcting operation step (S402), a D/A conversion step (S406), and a writing step (S502).

First, it is necessary to measure the amount of position error resulting from distortion of the reflective mirror 209 of the pattern writing apparatus 100 in advance. Furthermore, when the target workpiece 101 is a mask for EUV, it is necessary to measure the amount of position error including the flexure caused by the three-point support.

Figure 3:
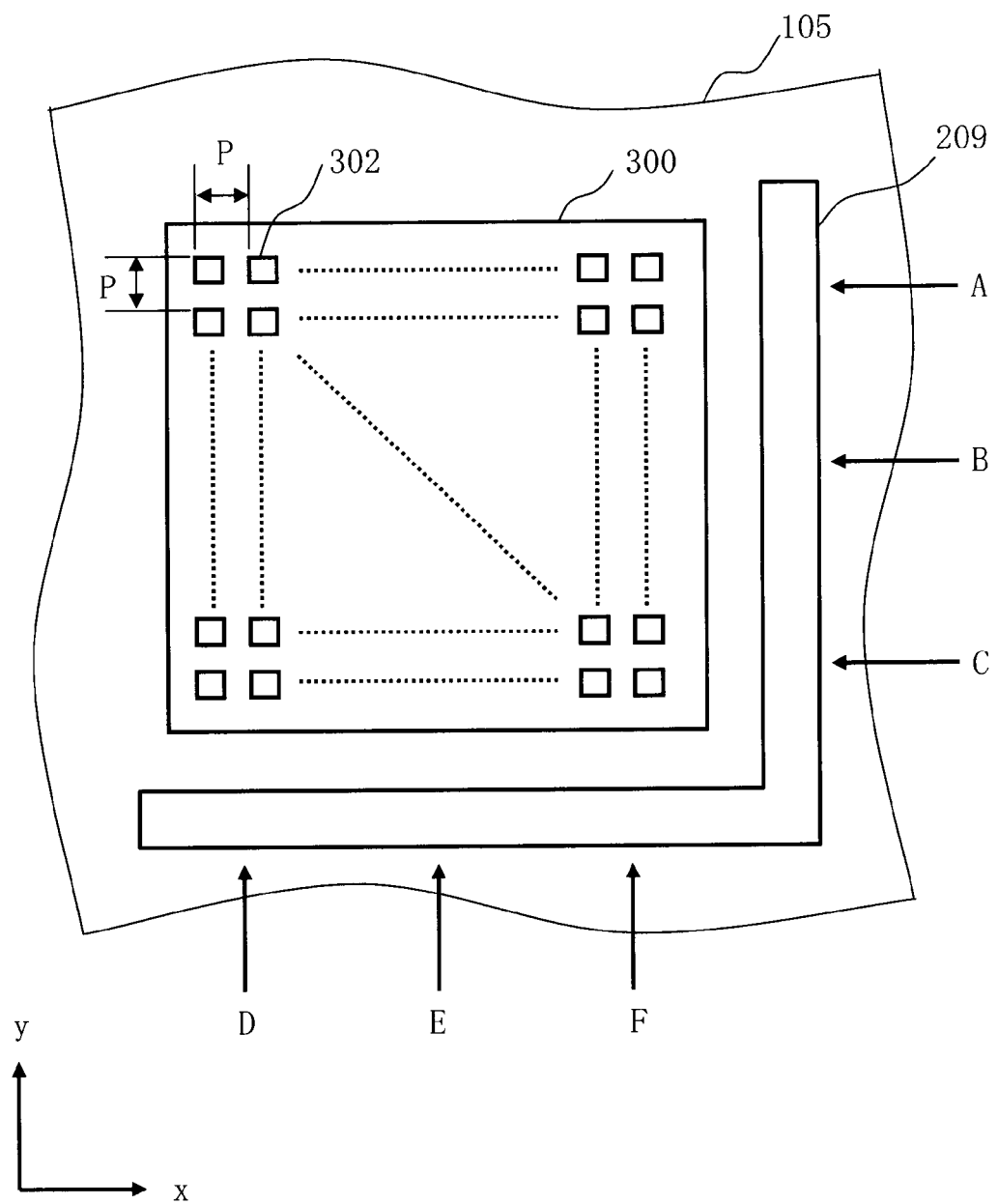
FIG. 3 is a schematic diagram for describing a method of measuring a global positional displacement by using a dummy substrate according to Embodiment 1.

FIG. 3 is a schematic diagram for describing a method of measuring a global positional displacement or "deviation" by using a dummy substrate according to Embodiment 1. It is preferable to use a dummy substrate 300 whose size and shape are the same as those of the target workpiece 101 to be actually written. What is necessary is to use a dummy substrate having a writing region of at least the same or larger than the target workpiece 101. Then, as shown in FIG. 3, the dummy substrate is placed at the same position as the target workpiece 101 by the same support method, for example, by a three-point support. Although not shown in FIG. 1, the reflective mirror 209 has reflective surfaces in x and y directions to measure each direction. A plurality of figures 302 are written by the pattern writing apparatus 100 so that they may be spread over almost all the writing region of the dummy substrate 300. In this case, a plurality of figures 302 are written at a pitch P in the x and y directions. For example, it is preferable to write figures, each being 1 μm square, to be side by side, at a pitch of 5 mm in the x and y directions, respectively. If the dummy substrate 300 has a writing region of 150 mm square, nine hundred figures 302, namely thirty pieces in a line in the x or y direction respectively, will be written. When writing the figure 302, it is necessary to move the XY stage 105 so that the region to be written may be in the deflection region of the electron beam 200. Therefore, for example, when writing the upper left part of the dummy substrate 300 of FIG. 3, a laser light irradiates around the part A of the reflective mirror 209 in order to measure in the x direction, and irradiates around the part D of the reflective mirror 209 in order to measure in the y direction, respectively. On the other hand, when writing the center part of the dummy substrate 300 of FIG. 3, a laser light irradiates around the part B of the reflective mirror 209 in order to measure in the x direction, and irradiates around the part E of the reflective mirror 209 in order to measure the y direction, respectively. When writing the lower right part of the dummy substrate 300 of FIG. 3, a laser light irradiates around the part C of the reflective mirror 209 in order to measure in the x direction, and irradiates around the part F of the reflective mirror 209 in order to measure in the y direction, respectively. Thus, the irradiated position on the reflective mirror 209 changes depending upon the point to be written. Thereby, the amount of positional displacement resulting from distortion of the reflective mirror can be measured by examining the positions of a plurality of written figures 302. Then, when correcting position accuracy degradation produced in the electron optical system, one mark on the XY stage 105 is scanned with the electron beam 200 to measure the amount of positional displacement. However, in this case, since the XY stage 105 stops at one place, it is impossible to know the influence of the distortion of the whole reflective mirror 209. On the other hand, according to the present Embodiment, the influence of the distortion on the whole reflective mirror 209 can be grasped by writing a plurality of figures 302 by using the pattern writing apparatus 100 so that they may be spread over almost all the writing region of the dummy substrate 300. The influence of the flexure produced by a three-point support can also be grasped by writing a plurality of figures 302 by using the pattern writing apparatus 100 so that they may be spread over almost all the writing region of the dummy substrate 300. When the written dummy substrate 300 is examined by using the same support method as that used for the pattern writing apparatus 100, the influence of the distortion of the whole reflective mirror 209, excluding the flexure, can be grasped. When the examining is performed by chucking the surface of the whole reverse side of the written dummy substrate 300, the influence including the flexure can be grasped. Moreover, if the difference between both the results is calculated, the influence only by the flexure can be grasped.

Figure 4:
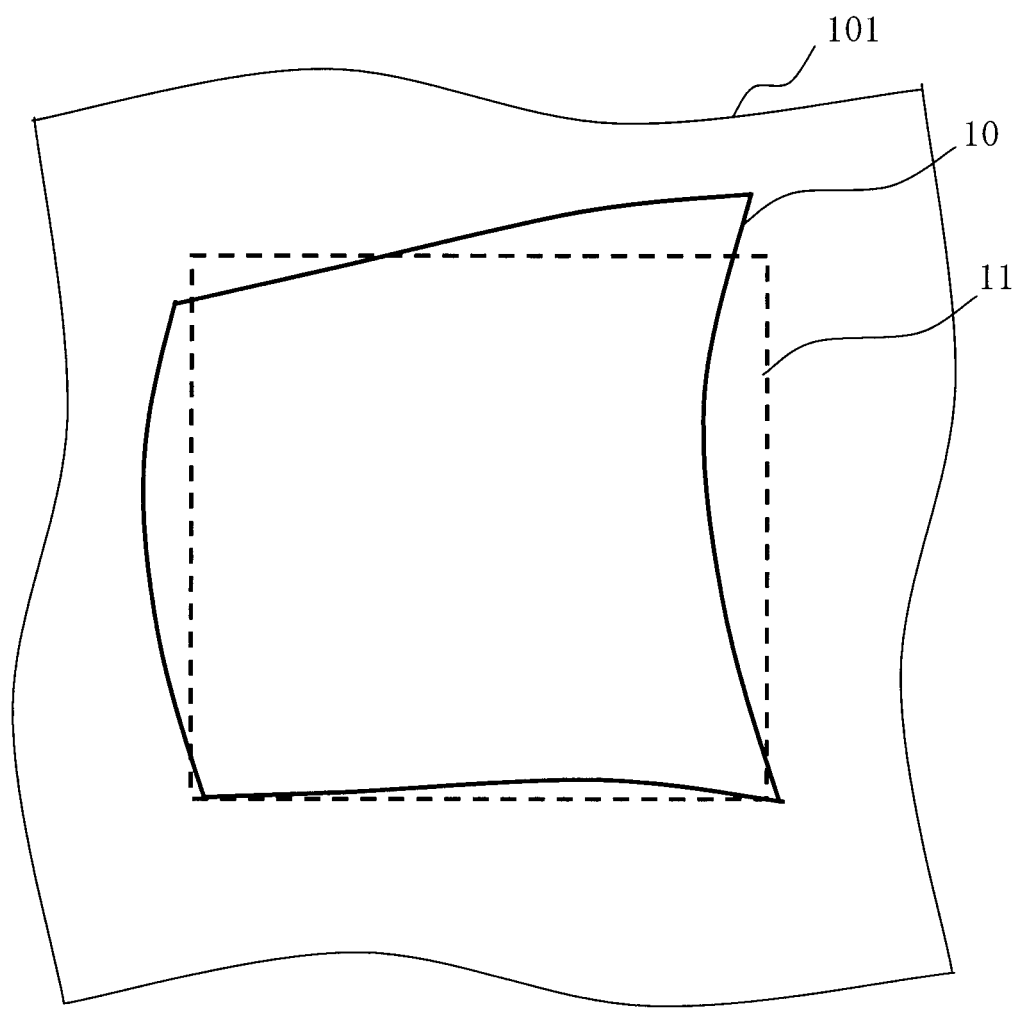
FIG. 4 shows an example of a global position error according to Embodiment 1.

FIG. 4 shows an example of a global position error described in Embodiment 1. When global distortion or flexure occurs in the writing region of the target workpiece 101 as mentioned above, a desired pattern 11 will be written as a pattern 10 having distortion.

Next, a method of correcting a global position error will be explained. The reference point (0, 0) of the coordinates is assumed to be the center of the mask. It is supposed that when a pattern is written at a target workpiece position $(X_0, Y_0)$ based on the design data, the pattern is actually formed at a position $(X_1^*, Y_1^*)$ on the target workpiece 101. If this target workpiece is used in other apparatus (e.g., an optical stepper or an EUV stepper), it is supposed that the pattern is formed at a position $(X_1^*, Y_1^*)$ of the coordinate system of the apparatus. As an example, if the relation of the position can be expressed by up to the third order with respect to the coordinates, $(X_1^*, Y_1^*)$ are expressed by using $(X_0, Y_0)$ as the following equations (0-1) and (0-2).

$$X_1^* = A^* + B_1^* X_0 + B_2^* Y_0 + C_1^* X_0^2 + C_2^* X_0 Y_0 + \\ C_3^* Y_0^2 + D_1^* X_0^3 + D_2^* X_0^2 Y_0 + D_3^* X_0 Y_0^2 + D_4^* Y_0^3 \quad (0\text{-}1)$$

$$Y_1^* = P^* + Q_1^* Y_0 + Q_2^* X_0 + R_1^* Y_0^2 + \\ R_2^* X_0 Y_0 + R_3^* X_0^2 + S_1^* Y_0^3 + S_2^* X_0 Y_0^2 + S_3^* X_0^2 Y_0 + S_4^* X_0^3 \quad (0\text{-}2)$$

In this case, the coefficients $A^*$, $B^*$, ..., $D^*_4$, $P^*$, $Q^*_1$, ..., $S^*_4$ are obtained from an experiment. First, a plurality of marks 302 spread over almost all of the writing region of the dummy substrate 300 are written without correcting, and then based on the positions of the written figures, a positional displacement (pattern distortion resulting from a global position error) is calculated by performing fitting. In contrast, if it is supposed that a position error can be corrected by moving the position $(X_0, Y_0)$ on the mask, serving as the target workpiece 101, based on the design data to the position ($X_1$, $Y_1$), the correction can be performed by the following correction relational expressions (1-1) and (1-2).

$$X_1 = A + B_1 X_0 + B_2 Y_0 + C_1 X_0^2 + C_2 X_0 Y_0 + C_3 Y_0^2 + D_1 X_0^3 + D_2 X_0^2 Y_0 + D_3 X_0 Y_0^2 + D_4 Y_0^3 \quad (1\text{-}1)$$

$$Y_1 = P + Q_1 Y_0 + Q_2 X_0 + R_1 Y_0^2 + R_2 X_0 Y_0 + R_3 X_0^2 + S_1 Y_0^3 + S_2 Y_0^2 X_0 + S_3 Y_0 X_0^2 + S_4 X_0^3 \quad (1\text{-}2)$$

A to D and P to S are coefficients of a third order polynomial. The values of these coefficients are determined to satisfy $X_1^* = X_0$ and $Y_1^* = Y_0$ when substituting these equations (1-1) and (1-2) into (0-1) and (0-2), or to approach $X_1^* = X_0$ and $Y_1^* = Y_0$ as much as possible.

Now, a certain SF (small region) will be considered. It is supposed that the reference position of the SF based on the design data is ($X_{0C}$, $Y_{0C}$). In this case, the center of the SF is to be the reference position of the SF, for example. However, the reference position of SF is not restricted to the center, and other point can also be the reference position. For example, one of the four corner points of SF or the center of gravity of SF may be sufficient. It is supposed that correcting can be performed by moving this reference position to the position ($X_{1C}$, $Y_{1C}$), and the position ($X_{1C}$, $Y_{1C}$) is formed at the position ($X_{0C}$, $Y_{0C}$) as just designed on the target workpiece. Then, the position ($X_{1C}$, $Y_{1C}$) can be expressed as the following equations (2-1) and (2-2) by using the equations (1-1) and (1-2).

$$X_{1C} = A + B_1 X_{0C} + B_2 Y_{0C} + C_1 X_{0C}^2 + C_2 X_{0C} Y_{0C} + C_3 Y_{0C}^2 + D_1 X_{0C}^3 + D_2 X_{0C}^2 Y_{0C} + D_3 X_{0C} Y_{0C}^2 + D_4 Y_{0C}^3 \quad (2\text{-}1)$$

$$Y_{1C} = P + Q_1 Y_{0C} + Q_2 X_{0C} + R_1 Y_{0C}^2 + R_2 X_{0C} Y_{0C} + R_3 X_{0C}^2 + S_1 Y_{0C}^3 + S_2 X_{0C} Y_{0C}^2 + S_3 X_{0C}^2 Y_{0C} + S_4 X_{0C}^3 \quad (2\text{-}2)$$

Then, the center ($X_{0c}$, $Y_{0c}$) of the SF in the writing region of the target workpiece 101, being a writing target of the main deflector 214, can be corrected to the position ($X_{1c}$, $Y_{1c}$) by using the correction parameters A, $B_1$, $B_2$, $C_1$, $C_2$, $C_3$, $D_1$, $D_2$, $D_3$, $D_4$, P, $Q_1$, $Q_2$, $R_1$, $R_2$, $R_3$, $S_1$, $S_2$, $S_3$ and $S_4$. The position ($X_{1c}$, $Y_{1c}$) becomes a corrected reference position of the SF.

Next, a global position error correction for an arbitrary position M in the SF will be explained. A position away from the reference point of the SF, for example the center position, by a relative distance ($x_0$, $y_0$) is considered. When the reference position is at the center of the SF, global position correction is unnecessary because there is no optical distortion, and the relative distance ($x_0$, $y_0$) corresponds to the amount of deflection from the center of the subfield. Since the position M is represented as ($X_{0c} + x_0$, $Y_{0c} + y_0$) using the mask coordinates based on the design data, if it is supposed the position on the mask after the correction is ($X_1$, $Y_1$), (X, Y) becomes equivalent to what is obtained by replacing $X_0$ with ($X_{0c} + x_0$) and $Y_0$ with ($Y_{0c} + y_0$) in the equations (1-1) and (1-2). That is, it can be expressed by the following equations (3-1) and (3-2).

$$X_1 = A + B_1(X_{0c} + x_0) + B_2(Y_{0c} + y_0) + C_1(X_{0c} + x_0)^2 + C_2(X_{0c} + x_0)(Y_{0c} + y_0) + C_3(Y_{0c} + y_0)^2 + D_1(X_{0c} + x_0)^3 + D_2(X_{0c}, + x_0)^2(Y_{0c} + y_0) + D_3(X_{0c} + x_0)(Y_{0c} + y_0)^2 + D_4(Y_{0c} + y_0)^3 \quad (3\text{-}1)$$

$$Y_1 = P + Q_1(Y_{0c} + y_0) + Q_2(X_{0c} + x_0) + R_1(Y_{0c} + y_0)^2 + R_2(X_{0c} + x_0)(Y_{0c} + y_0) + R_3(X_{0c} + x_0)^2 + S_1(Y_{0c} + y_0)^3 + S_2(X_{0c} + x_0)(Y_{0c} + y_0)^2 + S_3(X_{0c} + x_0)^2(Y_{0c} + y_0) + S_4(X_{0c} + x_0)^3 \quad (3\text{-}2)$$

Supposing that the position ($x_1$, $y_1$) on the mask after the correction is away from the center position ($X_{1C}$, $Y_{1C}$) of the SF after the correction by a relative distance ($x_1'$, $y_1'$), ($x_1'$, $y_1'$) can be expressed by the following equations (4-1) and (4-2).

$$x_1' = X_1 - X_{1C} \quad (4\text{-}1)$$

$$y_1' = Y_1 - Y_{1C} \quad (4\text{-}2)$$

When substituting the equations (2-1), (2-2), (3-1), and (3-2) into the equations (4-1) and (4-2), it can be expressed by the following equations (5-1) and (5-2).

$$\begin{aligned}x_1' &= X_1 - X_{1C} \\ &= A + B_1(X_{0C} + x_0) + B_2(Y_{0C} + y_0) + C_1(X_{0C} + x_0)^2 + \\ & \quad C_2(X_{0C} + x_0)(Y_{0C} + y_0) + C_3(Y_{0C} + y_0)^2 + \\ & \quad D_1(X_{0C} + x_0)^3 + D_2(X_{0C} + x_0)^2(Y_{0C} + y_0) + \\ & \quad D_3(X_{0C} + x_0)(Y_{0C} + y_0)^2 + D_4(Y_{0C} + y_0)^2 - \\ & \quad [A + B_1 X_{0C} + B_2 Y_{0C} + c_1 X_0^2 + c_2 X_{0C} Y_{0C} + \\ & \quad c_3 Y_{0C}^2 + D_1 X_{0C}^3 + D_2 X_{0C}^2 Y_{0C} + D_3 X_{0C} Y_{0C}^2 + D_4 Y_{0C}^3] \end{aligned} \quad (5\text{-}1)$$

$$\begin{aligned}y_1' &= Y_1 - Y_{1C} \\ &= P + Q_1(Y_{0C} + y_0) + Q_2(X_{0C} + x_0) + R_1(Y_{0C} + y_0)^2 + \\ & \quad R_2(X_{0C} + x_0)(Y_{0C} + y_0) + R_3(X_{0C} + x_0)^2 + \\ & \quad S_1(Y_{0C} + y_0)^3 + S_2(X_{0C} + x_0)(Y_{0C} + y_0)^2 + \\ & \quad S_3(X_{0C} + x_0)^2(Y_{0C} + y_0) + S_4(X_{0C} + x_0)^3 - \\ & \quad [P + Q_1 Y_{0C} + Q_2 X_{0C} + R_1 Y_{0C}^2 + R_2 X_{0C} Y_{0C} + \\ & \quad R_3 X_{0C}^2 + S_1 Y_{0C}^3 + S_2 X_{0C} Y_{0C}^2 + S_3 X_{0C}^2 Y_{0C} + S_4 X_{0C}^3] \end{aligned} \quad (5\text{-}2)$$

Then, in order to avoid complication, the right-hand side of the equation (4-1) is expressed as $F(X_{0C}, x_0, Y_{0C}, y_0)$, and the right-hand side of the equation (4-2) is expressed as $G(X_{0C}, x_0, Y_{0C}, y_0)$. That is, they are defined as the following equations (6-1) and (6-2).

$$x_1' = F(X_{0C}, x_0, Y_{0C}, y_0) \quad (6\text{-}1)$$

$$y_1' = G(X_{0C}, x_0, Y_{0C}, y_0) \quad (6\text{-}2)$$

These functions can be expressed by the following equations (7-1) and (7-2) using products of up to the third order with respect to $x_0$ and $y_0$.

$$\begin{aligned}F(X_{0C}, x_0, Y_{0C}, y_0) &= x_1' \\ &= A' + B_1' x_0 + B_2' y_0 + C_1' x_0^2 + C_2' x_0 y_0 + \\ & \quad C_3' y_0^2 + D_1' x_0^3 + D_2' x_0^2 y_0 + D_3' x_0 y_0^2 + \\ & \quad D_4' y_0^3 \end{aligned} \quad (7\text{-}1)$$

$$\begin{aligned}G(X_{0C}, x_0, Y_{0C}, y_0) &= y_1' \\ &= P' + Q_1' y_0 + Q_2' x_0 + R_1' y_0^2 + R_2' x_0 y_0 + \\ & \quad R_3' x_0^2 + S_1' y_0^3 + S_2' x_0 y_0^2 + S_3' x_0^2 y_0 + S_4' x_0^3 \end{aligned} \quad (7\text{-}2)$$

These coefficients can be expressed as the following equations (8-1) to (8-20).

$$A' = 0 \quad (8\text{-}1)$$

$$B_1' = B_1 + 2C_1 X_{0C} + C_2 Y_0 C + 3D_1 X_{0C}^2 + 2D_2 X_{0C} Y_{0C} + D_3 Y_0 C^2 \quad (8\text{-}2)$$

$$B_2' = B_2 + 2C_3 Y_{0C} + C_2 X_0 C + 3D_4 Y_0 C^2 + 2D_3 X_0 Y_{0C} + D_2 X_0 C^2 \quad (8\text{-}3)$$

$$C_1' = C_1 + 3D_1 X_{0C} + D_2 Y_0 C \tag{8-4}$$

$$C_2' = C_2 + 2D_2 X_0 C + 2D_3 Y_0 C \tag{8-5}$$

$$C_3' = C_3 + 3D_4 Y_{0C} + D_3 X_0 C \tag{8-6}$$

$$D_1' = D_1 \tag{8-7}$$

$$D_2' = D_2 \tag{8-8}$$

$$D_3' = D_3 \tag{8-9}$$

$$D_4' = D_4 \tag{8-10}$$

$$P' = 0 \tag{8-11}$$

$$Q_1' = Q_1 + 2R_1 Y_{0C} + R_2 X_0 C + 3S_1 Y_0 C^2 + 2S_2 X_{0C} Y_{0C} + S_3 X_0 C^2 \tag{8-12}$$

$$Q_2' = Q_2 + 2R_3 X_{0C} + R_2 Y_0 C + 3S_4 X_0 C^2 + 2S_3 X_{0C} Y_{0C} + S_2 Y_0 C^2 \tag{8-13}$$

$$R_1' = R_1 + 3S_1 Y_{0C} + S_2 X_0 C \tag{8-14}$$

$$R_2' = R_2 + 2S_2 Y_0 C + 2S_3 X_0 C \tag{8-15}$$

$$R_3' = R_3 + 3S_4 X_{0C} + S_3 Y_0 C \tag{8-16}$$

$$S_1' = S_1 \tag{8-17}$$

$$S_2' = S_2 \tag{8-18}$$

$$S_3' = S_3 \tag{8-19}$$

$$S_4' = S_4 \tag{8-20}$$

Thus, by calculating the equations (7-1) and (7-2), a relative distance $(x_1', y_1')$ from the center position $(X_{1C}, Y_{1C})$ of the SF after the correction to an arbitrary position $(x_1, y_1)$ in the SF after the correction can be calculated. That is, by performing this calculation, it is possible to correct a relative distance $(x_0, y_0)$ from the center position $(X_{1C}, Y_{1C})$ of the SF to the arbitrary position in the SF. Thereby, global distortion at the arbitrary position in the SF can be corrected. In calculating the relative distance $(x_1', y_1')$, it is possible to correct the relative distance $(x_0, y_0)$ from the center position $(X_{1C}, Y_{1C})$ to the arbitrary position in the SF by using the center position $(X_{0C}, Y_{0C})$ of the SF and coefficients of a correction equation for correcting the center position $(X_{0C}, Y_{0C})$ of the SF. Concretely, as shown in the equations (8-1) to (8-20), the correction parameters of the equations (7-1) and (7-2), namely A', $B_1'$, $B_2'$, $C_1'$, $C_2'$, $C_3'$, $D_1'$, $D_2'$, $D_3'$, $D_4'$, P', $Q_1'$, $Q_2'$, $R_1'$, $R_2'$, $R_3'$, $S_1'$, $S_2'$, $S_3'$, and $S_4'$ can be calculated by using the center position $(X_{0C}, Y_{0C})$ of the SF before the correction and the correction parameters of the equations (1-1) and (1-2), namely A, $B_1$, $B_2$, $C_1$, $C_2$, $C_3$, $D_1$, $D_2$, $D_3$, $D_4$, P, $Q_1$, $Q_2$, $R_1$, $R_2$, $R_3$, $S_1$, $S_2$, $S_3$, and $S_4$.

As mentioned above, when the arbitrary position (x', y') after the global correction in the subfield in the pattern writing apparatus 100 is irradiated by a beam, distortion of the electron optical system also exists. Therefore, if distortion of the electron optical system in addition to distortion of the reflective mirror 209 can be corrected, it becomes possible to perform writing more highly precisely. Then furthermore, the coefficients of the correction equation for a global correction of distortion etc. of the reflective mirror 209 are combined with the coefficients of the correction equation for a distortion correction of the electron optical system. The relational expression for correcting a distortion of the electron optical system can be expressed by the following equations (9-1) and (9-2)

$$X_E = H(x', y') \tag{9-1}$$
$$= a + b_1 x' + b_2 y' + c_1 x'^2 + c_2 x' y' + c_3 y'^2 + d_1 x'^3 + d_2 x'^2 y' + d_3 x' y'^2 + d_4 y'^3$$

$$Y_E = I(x', y') \tag{9-2}$$
$$= p + q_1 y' + q_2 x' + r_1 y'^2 + r_2 x' y' + r_3 x'^2 + s_1 y'^3 + s_2 x' y'^2 + s_3 x'^2 y' + s_4 x'^3$$

As mentioned above, the correction parameters of the equations (9-1) and (9-2), namely a, $b_1$, $b_2$, ..., $d_3$, $d_4$, p, $q_1$, $q_2$, ..., $s_3$ and $s_4$, can be obtained by setting one mark prepared on the XY stage 105 at a plurality of positions by moving the XY stage 105 in the main deflection region and the sub deflection region, measuring a positional displacement amount of each of the plurality of positions by scanning with the electron beam 200 at each of the plurality of positions, and fitting a plurality of positional displacement amounts measured.

When x' and y' of the equations (9-1) and (9-2) are replaced with $x_1'$ and $y_1'$ by using the equations (6-1) and (6-2), the equations (9-1) and (9-2) can be expressed as the following equations (10-1) and (10-2).

$$X_E = H(x', y') \tag{10-1}$$
$$= H(F(X_{0c}, x_0, Y_{0c}, y_0), G(X_{0c}, x_0, Y_{0c}, y_0))$$

$$Y_E = I(x', y') \tag{10-2}$$
$$= I(F(X_{0c}, x_0, Y_{0c}, y_0), G(X_{0c}, x_0, Y_{0c}, y_0))$$

That is, the equations (10-1) and (10-2) are polynomials with respect to $x_0$ and $y_0$. Then, rearranging the equations (10-1) and (10-2) for $x_0$ and $y_0$ by disregarding the term of the fourth or greater order as a slight amount, they can be expressed as the following equations (11-1) and (11-2).

$$X_E = H(x', y') \tag{11-1}$$
$$= a' + b_1' x_0 + b_2' y_0 + c_1' x_0^2 + c_2' x_0 y_0 + c_3' y_0^2 + d_1' x_0^3 + d_2' x_0^2 y_0 + d_3' x_0 y_0^2 + d_4' y_0^3$$

$$Y_E = I(x', y') \tag{11-2}$$
$$= p' + q_1' y_0 + q_2' x_0 + r_1' y_0^2 + r_2' x_0 y_0 + r_3' x_0^2 + s_1' y_0^3 + s_2' x_0 y_0^2 + s_3' x_0^2 y_0 + s_4' x_0^3$$

These coefficients a', $b_1'$, $b_2'$, ..., $d_3'$, $d_4'$, p', $q_1'$, $q_2'$, ..., $s_3'$ and $S_4'$ can be expressed by a, $b_1$, $b_2$, ..., $d_3$, $d_4$, p, $q_1$, $q_2$, ..., $s_3$, $s_4$, A', $B_1'$, $B_2'$, ..., $D_3'$, $D_4'$, P', $Q_1'$, $Q_2'$, $S_3'$ and $S_4'$. a', $b_1'$, $b_2'$, ..., $d_3'$, and $d_4'$ will be as follows:
(Expressions on the Coefficients of $X_E$)

$$a' = a$$

$$b_1' = b_1 B_1' + b_2 Q_2'$$

$$b_2' = b_1 B_2' + b_2 Q_1'$$

$$c_1' = b_1 C_1' + b_2 R_3' + c_1 B_1'^2 + c_2 B_1' Q_2' + c_3 Q_2'^2$$

$$c_2' = b_1 C_2' + b_2 R_2' + 2c_1 B_1' B_2' + c_2 (B_1' Q_1' + B_2' Q_2') + 2c_3 Q_1' Q_2'$$

$$c_3' = b_1 C_3' + b_2 R_1' + c_1 B_2'^2 + c_2 B_2' Q_1' + c_3 Q_1'^2$$

-continued $$d'_1 = b_1 D'_1 + b_2 S'_4 + 2c_1 B'_1 C'_1 + 2c_3 Q'_2 R'_3 +$$
$$c_2(B'_1 R'_3 + Q'_2 C'_1) + d_1 B'^3_1 + d_4 Q'^3_2 + d_2 B'^2_1 Q'_2 + d_3 B'_1 Q'^2_2$$

$$d'_2 = b_1 D'_2 + b_2 S'_3 + 2c_1(B'_1 C'_2 + B'_2 C'_1) + 2c_3(Q'_1 R'_3 + Q'_2 R'_2) +$$
$$c_2(B'_1 R'_2 + B'_2 R'_3 + Q'_1 C'_1 + Q'_2 C'_2) + 3d_1 B'^2_1 B'_2 + 3d_4 Q'_1 Q'^2_2 +$$
$$d_2(B'^2_1 Q'_1 + 2B'_1 B'_2 Q'_2) + d_3(2B'_1 Q'_1 Q'_2 + B'_2 Q'^2_2)$$

$$d'_3 = b_1 D'_3 + b_2 S'_2 + 2c_1(B'_1 C'_3 + B'_2 C'_2) + 2c_3(Q'_1 R'_2 + Q'_2 R'_1) +$$
$$c_2(B'_1 R'_1 + B'_2 R'_2 + Q'_1 C'_2 + Q'_2 C'_3) + 3d_1 B'_1 B'^2_2 + 3d_4 Q'^2_1 Q'_2 +$$
$$d_2(B'^2_2 Q'_2 + 2B'_1 B'_2 Q'_1) + d_3(2B'_2 Q'_1 Q'_2 + B'_1 Q'^2_1)$$

$$d'_4 = b_1 D'_4 + b_2 S'_1 + 2c_1 B'_2 C'_3 + 2c_3 Q'_1 R'_1 + c_2(B'_2 R'_1 + Q'_1 C'_3) +$$
$$d_1 B'^3_2 + d_4 Q'^3_1 + d_2 B'^2_2 Q'_1 + d_3 B'_2 Q'^2_1$$

By using these equations, p', $q_1'$, $q_2'$, . . . , $s_3'$, and $s_4'$ can be calculated as follows using symmetrical property.

Moreover, the following replacement will be performed.
(Replacement 1)
A'<->P',
$B_1'$<->$Q_2'$, $B_2'$<->$Q_1'$
$C_1'$<->$R_3'$, $C_2'$<->$R_2$, $C_3'$<->$R_1'$
$D_1'$<->$S_4'$, $S_2'$<->$S_3'$, $D_3'$<->$S_2'$, $D_4'$<->$S_1'$ In this case, α<->β indicates to replace α with β and β with α. When performing this replacement for the equations (7-1) and (7-2), the equation (7-1) turns into the equation (7-2), and the equation (7-2) turns into the equation (7-1). That is, x' and y' can be exchanged with each other by the (Replacement 1). This has an effect of replacing x' and y' with each other as shown in the following (Replacement 1)'.
(Replacement 1)'
x'<->y'

Furthermore, the following replacement will be considered.
(Replacement 2)
a->p
$b_{1->q_1}$, $b_2$->$q_2$
$c_1$->$_1$, $c_2$->$r_2$, $c_3$->$r_3$
$d_1$->$s_1$, $d_2$->$s_2$, $d_3$->$s_3'$, $d_4$->$s_4$ In this case, α->β indicates to replace α with β. When performing (Replacement 1)' (namely, Replacement 1) and (Replacement 2) for the equation (9-1), the equation (9-1) turns into the equation (9-2).

Expressing the equation (9-1) by a polynomial of $x_0$ and $y_0$, it becomes the equation (11-1), and its coefficients are a', b1', . . . . Considering that the roles of $x_0$ and $y_0$ are opposite each other in the equations (9-1) and (9-2), the relation among these coefficients is as follows:
(Correspondence 1)
a'->p'
$b_1'$->$q_2'$, $b_2'$->$q_1'$
$c_1'$->$r_3'$, $c_2'$->$r_2'$, $c_3'$->$r_1'$
$d_1'$->$s_4'$, $d_2'$->$s_3'$, $d_3'$->$s_2'$, $d_4'$->$s_1'$ Therefore, performing the (Replacement 1) and the (Replacement 2) for the above (Expressions on the coefficients of $X_E$) and utilizing the (Correspondence 1), the (Expressions on the coefficients of $X_E$) can be obtained.

Some examples are shown as follows:

$$a'=a \quad \text{(Example 1)}$$

a' can be p' according to the (Correspondence 1), and a can be p according to the (Replacement 2). As a result, p'=p is obtained.

$$b_1' = b_1 B_1' + b_2 Q_2' \quad \text{(Example 2)}$$

$b_1'$ can be $q_2'$ according to the (Correspondence 1). $B_1'$ can be $Q_2'$ and $Q_2'$ can be $B_1'$ according to the (Replacement 1). $b_1$ can be $p_1$ and $b_2$ can be $p_2$ according to the (Replacement 2). That is, $p_2' = b_1 Q_2' + b_2 B_1'$ Thus, it is possible to obtain all of the (Expressions on the coefficients of $X_E$) by performing only the replacement.

(Expressions on the Coefficients of $Y_E$)

$$p' = p$$
$$q_2' = q_1 Q_2' + q_2 B_1'$$
$$q_1' = q_1 Q_1' + q_2 B_2'$$
$$r_3' = q_1 R_3' + q_2 C_1' + r_1 Q_2'^2 + r_2 B_1' Q_2' + r_3 B_1'^2$$
$$r_2' = q_1 R_2' + q_2 C_2' + 2r_1 Q_1' Q_2' + r_2(Q_2' B_2' + Q_1' B_1') + 2r_3 B_2' B_1'$$
$$r_1' = q_1 R_1' + q_2 C_3' + r_1 Q_1'^2 + r_2 B_2' Q_1' + r_3 B_2'^2$$
$$s_4' = q_1 S_4' + q_2 D_1' + 2r_1 Q_2' R_3' + 2r_3 B_1' C_1' +$$
$$r_2(Q_2' C_1' + B_1' R_3') + s_1 Q_2'^3 + s_4 B_1'^3 + s_2 Q_2'^2 B_1' + s_3 Q_2' B_1'^2$$
$$s_3' = q_1 S_3' + q_2 D_2' + 2r_1(Q_2' R_2' + Q_1' R_3') + 2r_3(B_2' C_1' + B_1' C_2') +$$
$$r_2(Q_2' C_2' + Q_1' C_1' + B_2' R_3' + B_1' R_2') + 3s_1 Q_2'^2 Q_1' + 3s_4 B_1'^2 B_2' +$$
$$s_2(Q_2'^2 B_2' + 2Q_2' Q_1' B_1') + s_3(2Q_2' B_1' B_2' + Q_1' B_1'^2)$$
$$s_2' = q_1 S_2' + q_2 D_3' + 2r_1(Q_2' R_1' + Q_1' R_2') + 2r_3(B_2' C_2' + B_1' C_3') +$$
$$r_2(Q_2' C_3' + Q_1' C_2' + B_2' R_2' + B_1' R_1') + 3s_1 Q_2' Q_1'^2 + 3s_4 B_2'^2 B_1' +$$
$$s_2(Q_1'^2 B_1' + 2Q_2' Q_1' B_2') + s_3(2Q_1' B_1' B_2' + Q_2' B_2'^2)$$
$$s_1' = q_1 S_1' + q_2 D_4' + 2r_1 Q_1' R_2' + 2r_3 B_2' C_3' +$$
$$r_2(Q_1' C_3' + B_2' R_1') + s_1 Q_1'^3 + s_4 B_2'^3 + s_2 Q_1'^2 B_2' + s_3 Q_1' B_2'^2$$

Then, A', $B_1'$, $B_2'$, . . . , $D_3'$, $D_4'$, P', $Q_1'$, $Q_2'$, . . . , $S_3'$ and $S_4'$ can be expressed by the equations (8-1) to (8-20). That is, the coefficients A', $B_1'$, $B_2'$, . . . , $D_3'$, $D_4'$, P', $Q_1'$, $Q_2'$, . . . , $S_3'$ and $S_4'$ depend on the coefficients A, $B_1$, $B_2$, etc. for correcting the global position error for the values ($X_{0c}$, $Y_{0c}$) of the reference position (the center of the subfield) of the subfield. In other words, by applying the distortion correction coefficient of the optical system in the subfield to the value of the subfield in the mask coordinates, it is possible to achieve correcting the global position error in addition to correcting the distortion of the optical system. That is, by applying the distortion correction coefficient of the optical system in the subfield to the value in the mask coordinates of the subfield, it is possible to perform a position correction more accurately. Therefore, what is necessary is to set the equations (11-1) and (11-2) and the correction parameters of the equations (11-1) and (11-2), namely a', $b_1'$, $b_2'$, . . . , $d_3'$, $d_4'$, p', $q_1'$ $q_2'$, . . . , $s_3'$ and $s_4'$, in the sub deflection operating unit 112.

Moreover, since distortion of the electron optical system similarly exists at the center position serving as the reference position of the SF, it becomes possible to perform writing more precisely by correcting the distortion of the electron optical system in addition to the distortion of the reflective mirror 209. Therefore, the coefficients to correct for a global correction of distortion of the reflective mirror 209 mentioned above are combined with the coefficients for correcting the distortion of the electron optical system.

Also in this case, it can be processed similarly to the example above mentioned. It is supposed that ($X_{0M}$, $Y_{0M}$) is the center position of a field on the design data. The position ($X_{1M}$, $Y_{1M}$) where the global position correction is performed for the position $(X_{0M}, Y_{0M})$ can be expressed as follows by using the equations (1-1) and (1-2).

$$X_{1M} = A + B_1 X_{0M} + B_2 Y_{0M} + C_1 X_{0M}^2 + C_2 X_{0M} Y_{0M} + \\ C_3 Y_{0M}^2 + D_1 X_{0M}^3 + D_2 X_{0M}^2 Y_{0M} + D_3 X_{0M} Y_{0M}^2 + D_4 Y_{0M}^3 \quad (12\text{-}1)$$

$$Y_{1M} = P + Q_1 X_{0M} + Q_2 Y_{0M} + R_1 X_{0M}^2 + R_2 X_{0M} Y_{0M} + \\ R_3 Y_{0M}^2 + S_1 X_{0M}^3 + S_2 X_{0M}^2 Y_{0M} + S_3 X_{0M} Y_{0M}^2 + S_4 Y_{0M}^3 \quad (12\text{-}2)$$

In the apparatus where the step & repeat method is adopted, what is necessary is to move the stage so that the optical center may be this position $(X_{1M}, Y_{1M})$, to apply a voltage to the main deflector, and to set a subfield with deflecting beams as stated below. On the other hand, in the method of stage continuous movement, it is processed as follows: First, when there is a subfield of a reference position $(X_{0M}, Y_{0M})$ on the design data, $(X_{1M}, Y_{1M})$ is calculated according to the equations (12-1) and (12-2). While the stage is continuously moving, the position (coordinate value) of the optical center can be detected by a laser interferometer. Then, when this coordinate value becomes $(X_{1M}, Y_{1M})$, the beam is deflected in order to set a subfield as stated below. In this case, it is assumed that the subfield position (reference position) on the design data is $(X_{0C}, Y_{0C})$ on the mask. Supposing that this position $(X_{0C}, Y_{0C})$ becomes a position $(X_{1C}, Y_{1C})$ by being performed a global position correction, the position $(X_{1C}, Y_{1C})$ can be expressed by the following equations according to the equations (1-1) and (1-2).

$$X_{1C} = A + B_1 X_{0C} + B_2 Y_{0C} + C_1 X_{0C}^2 + C_2 X_{0C} Y_{0C} + \\ C_3 Y_{0C}^2 + D_1 X_{0C}^3 + D_2 X_{0C}^2 Y_{0C} + D_3 X_{0C} Y_{0C}^2 + D_4 Y_{0C}^3 \quad (13\text{-}1)$$

$$Y_{1C} = P + Q_1 X_{0C} + Q_2 Y_{0C} + R_1 X_{0C}^2 + R_2 X_{0C} Y_{0C} + \\ R_3 Y_{0C}^2 + S_1 X_{0C}^3 + S_2 X_{0C}^2 Y_{0C} + S_3 X_{0C} Y_{0C}^2 + S_4 Y_{0C}^3 \quad (13\text{-}2)$$

The deflection amount $(\Delta X_{1C}, \Delta Y_{1C})$ by the main deflector in writing is defined below.

$$\Delta X_{1C} = X_{1C} - X_{1M} \quad (14\text{-}1)$$

$$\Delta Y_{1C} = Y_{1C} - Y_{1M} \quad (14\text{-}2)$$

This can be expressed as follows by using the equations (12-1) and (12-2).

$$\Delta X_{1C} = A + B_1 X_{0C} + B_2 Y_{0C} + C_1 X_{0C}^2 + C_2 X_{0C} Y_{0C} + C_3 Y_{0C}^2 + \\ D_1 X_{0C}^3 + D_2 X_{0C}^2 Y_{0C} + D_3 X_{0C} Y_{0C}^2 + D_4 Y_{0C}^3 - X_{1M} \quad (15\text{-}1)$$

$$\Delta Y_{1C} = P + Q_1 X_{0C} + Q_2 Y_{0C} + R_1 X_{0C}^2 + R_2 X_{0C} Y_{0C} + \\ R_3 Y_{0C}^2 + S_1 X_{0C}^3 + S_2 X_{0C}^2 Y_{0C} + S_3 X_{0C} Y_{0C}^2 + S_4 Y_{0C}^3 - Y_{1M} \quad (15\text{-}2)$$

The difference $(\Delta X_{0C}, \Delta Y_{0C})$ between the reference position $(X_{0C}, Y_{0C})$ of the subfield on the design data and the center position $(X_{0M}, Y_{0M})$ of the field on the design data is defined below.

$$\Delta X_{0C} = X_{0C} - X_{0M} \quad (16\text{-}1)$$

$$\Delta Y_{0C} = Y_{0C} - Y_{0M} \quad (16\text{-}2)$$

The equations (15-1) and (15-2) can be transformed as follows by using the equations (16-1) and (16-2) and the equations (13-1) and (13-2).

$$\Delta X_{1C} = \quad (17\text{-}1) \\ A + B_1(\Delta X_{0C} + X_{0M}) + B_2(\Delta Y_{0C} + Y_{0M}) + C_1(\Delta X_{0C} + X_{0M})^2 + \\ C_2(\Delta X_{0C} + X_{0M})(\Delta Y_{0C} + Y_{0M}) + C_3(\Delta Y_{0C} + Y_{0M})^2 + \\ D_1(\Delta X_{0C} + X_{0M})^3 + D_2(\Delta X_{0C} + X_{0M})^2(\Delta Y_{0C} + Y_{0M}) + \\ D_3(\Delta X_{0C} + X_{0M})(\Delta Y_{0C} + Y_{0M})^2 + D_4(\Delta Y_{0C} + Y_{0M})^3 - \\ \begin{bmatrix} A + B_1 X_{0M} + B_2 Y_{0M} + C_1 X_{0M}^2 + C_2 X_{0M} Y_{0M} + \\ C_3 Y_{0M}^2 + D_1 X_{0M}^3 + D_2 X_{0M}^2 Y_{0M} + D_3 X_{0M} Y_{0M}^2 + D_4 Y_{0M}^3 \end{bmatrix}$$

$$\Delta Y_{1C} = P + Q_1(\Delta X_{0C} + X_{0M}) + Q_2(\Delta Y_{0C} + Y_{0M}) + \quad (17\text{-}2) \\ R_1(\Delta X_{0C} + X_{0M})^2 + R_2(\Delta X_{0C} + X_{0M})(\Delta Y_{0C} + Y_{0M}) + \\ R_3(\Delta Y_{0C} + Y_{0M})^2 + S_1(\Delta X_{0C} + X_{0M})^3 + \\ S_2(\Delta X_{0C} + X_{0M})^2(\Delta Y_{0C} + Y_{0M}) + \\ S_3(\Delta X_{0C} + X_{0M})(\Delta Y_{0C} + Y_{0M})^2 + S_4(\Delta Y_{0C} + Y_{0M})^3 - \\ \begin{bmatrix} P + Q_1 X_{0M} + Q_2 Y_{0M} + R_1 X_{0M}^2 + R_2 X_{0M} Y_{0M} + \\ R_3 Y_{0M}^2 + S_1 X_{0M}^3 + S_2 X_{0M}^2 Y_{0M} + S_3 X_{0M} Y_{0M}^2 + S_4 Y_{0M}^3 \end{bmatrix}$$

Arranging the equations (17-1) and (17-2) with respect to $\Delta X_{0C}$ and $\Delta Y_{0C}$, it will be expressed as follows:

$$\Delta X_{1C} = \quad (18\text{-}1) \\ A'' + B_1'' \Delta X_{0C} + B_2'' \Delta Y_{0C} + C_1'' \Delta X_{0C}^2 + C_2'' \Delta X_{0C} \Delta Y_{0C} + C_3'' \Delta Y_{0C}^2 + \\ D_1'' \Delta X_{0C}^3 + D_2'' \Delta X_{0C}^2 \Delta Y_{0C} + D_3'' \Delta X_{0C} \Delta Y_{0C}^2 + D_4'' \Delta Y_{0C}^3$$

$$\Delta Y_{1C} = P'' + Q_1'' \Delta X_{0C} + Q_2'' \Delta Y_{0C} + R_1'' \Delta X_{0C}^2 + R_2'' \Delta X_{0C} \Delta Y_{0C} + \quad (18\text{-}2) \\ R_3'' \Delta Y_{0C}^2 + S_1'' \Delta X_{0C}^3 + S_2'' \Delta X_{0C}^2 \Delta Y_{0C} + S_3'' \Delta X_{0C} \Delta Y_{0C}^2 + S_4'' \Delta Y_{0C}^3$$

Then, $A'', \ldots, S''_4$ are expressed as follows:

$$A'' = 0 \quad (19\text{-}1)$$

$$B_1'' = B_1 + 2C_1 X_{0M} + C_2 Y_0 M + 3D_1 X_0 M^2 + 2D_2 X_{MC} Y_{MC} + D_3 Y_{MC}^2 \quad (19\text{-}2)$$

$$B_2'' = B_2 + 2C_3 Y_{MC} + C_2 X_{MC} + 3D_4 Y_{MC}^2 + 2D_3 X_{0M} Y_{0M} + D_2 X_0 M^2 \quad (19\text{-}3)$$

$$C_1'' = C_1 + 3D_1 X_{0M} + D_2 Y_0 M \quad (19\text{-}4)$$

$$C_2'' = C_2 + 2D_2 X_0 M + 2D_3 Y_0 M \quad (19\text{-}5)$$

$$C_3'' = C_3 + 3D_4 Y_{0M} + D_3 X_0 M \quad (19\text{-}6)$$

$$D_1'' = D_1 \quad (19\text{-}7)$$

$$D_2'' = D_2 \quad (19\text{-}8)$$

$$D_3'' = D_3 \quad (19\text{-}9)$$

$$D_4'' = D_4 \quad (19\text{-}10)$$

$$P'' = 0 \quad (19\text{-}11)$$

$$Q_1'' = Q_1 + 2R_1 Y_{0M} + R_2 X_0 M + 3S_1 Y_0 M^2 + 2S_2 X_{0M} Y_{0M} + S_3 X_0 M^2 \quad (19\text{-}12)$$

$$Q_2'' = Q_2 + 2R_3 X_{0M} + R_2 Y_0 M + 3S_4 X_0 M^2 + 2S_3 X_{0M} Y_{0M} + S_2 Y_0 M^2 \quad (19\text{-}13)$$

$$R_1'' = R_1 + 3S_1 Y_{0M} + S_2 X_0 M \quad (19\text{-}14)$$

$$R_2'' = R_2 + 2S_2 Y_0 M + 2S_3 X_0 M \quad (19\text{-}15)$$

$$R_3'' = R_3 + 3S_4 X_{0M} + S_3 Y_0 M \quad (19\text{-}16)$$

$$S_1'' = S_1 \quad (19\text{-}17)$$

$$S_2'' = S_2 \quad (19\text{-}18)$$

$$S_3''=S_3 \qquad (19\text{-}19)$$

$$S_4''=S_4 \qquad (19\text{-}20)$$

Then, for correcting the main deflection distortion, in order to actually deflect the subfield position (reference position) by the amount of $(\Delta X_{1C}, \Delta Y_{1C})$, it is necessary to set a deflection amount different from the amount $(\Delta X_{1C}, Y_{1C})$. Expressing this deflection amount to be set, as $(\Delta X_{2C}, \Delta Y_{2C})$, and performing correction up to the third order with respect to $\Delta X_{1C}$ and $\Delta Y_{1C}$, the correction equation can be expressed as follows:

$$\Delta X_{2C} = a'' + b_1'' \Delta X_{1C} + b_2'' \Delta Y_{1C} + c_1'' \Delta X_{1C}^2 + c_2'' \Delta X_{1C} \Delta Y_{1C} + \quad (20\text{-}1)$$
$$c_3'' \Delta Y_{1C}^2 + d_1'' \Delta X_{1C}^3 + d_2'' \Delta X_{1C}^2 \Delta Y_{1C} + d_3'' \Delta X_{1C} \Delta Y_{1C}^2 + d_4'' \Delta Y_{1C}^3$$

$$\Delta Y_{2C} = p'' + q_1'' \Delta X_{1C} + q_2'' \Delta Y_{1C} + r_1'' \Delta X_{1C}^2 + r_2'' \Delta X_{1C} \Delta Y_{1C} + \quad (20\text{-}2)$$
$$r_3'' \Delta Y_{1C}^2 + s_1'' \Delta X_{1C}^3 + s_2'' \Delta X_{1C}^2 \Delta Y_{1C} + s_3'' \Delta X_{1C} \Delta Y_{1C}^2 + s_4'' \Delta Y_{1C}^3$$

In this case, $a''$, ..., $s''_4$ are parameters for correcting a deflection distortion, and values obtained by adjusting the main deflection in the electron optical system. As mentioned above, these values can be obtained by setting one mark prepared on the XY stage 105 at a plurality of positions by moving the XY stage 105 in the main deflection region, measuring a positional displacement amount at each of the plurality of positions by scanning with the electron beam 200 at each of the plurality of positions, and fitting a plurality of positional displacement amounts measured.

Then, replacing $\Delta X_{1C}$ and $\Delta Y_{1C}$ of the equations (20-1) and (20-2) with $\Delta X_{0C}$ and $\Delta Y_{0C}$ by using the equations (18-1) and (18-2), and disregarding the term of the fourth or greater order with respect to $\Delta X_{0C}$ and $\Delta Y_{0C}$ as a slight amount, the equations (20-1) and (20-2) can be expressed by the following equations (21-1) and (21-2).

$$\Delta X_{2C} = a''' + b_1''' \Delta X_{0C} + b_2''' \Delta Y_{0C} + \quad (21\text{-}1)$$
$$c_1''' \Delta X_{0C}^2 + c_2''' \Delta X_{0C} \Delta Y_{0C} + c_3''' \Delta Y_{0C}^2 + d_1''' \Delta X_{0C}^3 +$$
$$d_2''' \Delta X_{0C}^2 \Delta Y_{0C} + d_3''' \Delta X_{0C} \Delta Y_{0C}^2 + d_4''' \Delta Y_{0C}^3$$

$$\Delta Y_{2C} = p''' + q_1''' \Delta X_{0C} + q_2''' \Delta Y_{0C} + r_1''' \Delta X_{0C}^2 + r_2''' \Delta X_{0C} \Delta Y_{0C} + \quad (21\text{-}2)$$
$$r_3''' \Delta Y_{0C}^2 + s_1''' \Delta X_{0C}^3 + s_2''' \Delta X_{0C}^2 \Delta Y_{0C} + s_3''' \Delta X_{0C} \Delta Y_{0C}^2 + s_4''' \Delta Y_{0C}^3$$

These coefficients $a'''$, ..., and $s_4'''$ can be expressed by using $a''$, ..., $s''_4$, $A''$, ..., and $S''_4$. Since the equations (18-1) and (18-2) have the same forms as the equations (7-1) and (7-2), the equations (20-1) and (20-2) have the same forms as the equations (9-1) and (9-2), and the equations (21-1) and (21-2) have the same forms as the equations (11-1) and (11-2), the coefficients $a'''$, and $s_4'''$ of the equations (21-1) and (21-2) can be obtained by similarly performing replacement using the (Expressions on the coefficients of $X_E$).

The coefficients $a'''$, ..., $s_4'''$ are expressed not only by the correction coefficients $a'''$, ..., $s_4'''$, but also by $A''$, ..., $S_4''$, that is A, ..., S, of the electron optical system. This simultaneously enables a global position correction and a distortion correction of the optical system.

These coefficients $a''$, $b_1''$, $b_2''$, ..., $d_3''$, $d_4''$, $p''$, $q_1''$, $q_2''$, $s_3''$, and $s_4''$ can be expressed using $a, b_1, b_2, \ldots, d_3, d_4, p, q_1, q_2, \ldots, s_3, s_4, A, B_1, B_2, \ldots, D_3, D_4, P, Q_1, Q_2, \ldots, S_3,$ and $S_4$.

That is, the coefficients $a''$, $b_1''$, $b_2''$, ..., $d_3''$, $d_4''$, $p''$, $q_1''$, $q_2''$, $s_3''$, and $s_4''$ depend on the coefficients A, $B_1$, $B_2$, etc. for correcting the global position error in the whole mask, and the values $(X_{0C}, Y_{0C})$ of the reference position (the center of the subfield) of the subfield in the mask coordinates. In other words, by changing the distortion correction coefficient of the optical system in the subfield to the value of the subfield in the mask coordinates, it is possible to achieve correcting the global position error in addition to correcting the distortion of the optical system. That is, by controlling the distortion correction coefficient of the optical system in the subfield by using the value in the mask coordinates of the subfield, it is possible to perform a position correction more accurately. Therefore, what is necessary is to set the equations (12-1) and (12-2) and the correction parameters of the equations (12-1) and (12-2), namely $a''$, $b_1''$, $b_2''$, ..., $d_3''$, $d_4''$, $p''$, $q_1''$, $q_2''$, ..., $s_3''$ and $s_4''$ in the main deflection operating unit 114.

The coefficients (correction parameters) and the correction equations have been obtained as mentioned above. Now, the writing operation by the pattern writing apparatus 100 is explained below.

In the step S102, as a writing data processing step, the writing control circuit 120 reads the writing data for one certain stripe from the magnetic disk device 109. Then, the writing control circuit 120 processes the read writing data and converts it into data of a format used in the apparatus when actually shooting the electron beam 200. In the writing data, coordinates indicating the position of a figure to be written, a figure code indicating the figure and a figure size, etc. are defined. The converted data is output to the deflection control circuit 110.

In the step S302, as a main deflection position correcting operation step, the main deflection operating unit 114 inputs the data converted from the writing data, and corrects the center position of the SF in the writing region of the target workpiece 101 based on the writing data. The main deflection operating unit 114 serves as an example of a first correction unit. The center position of the SF is corrected based on a pattern distortion obtained from the positions of a plurality of marks 302 which are spread over almost all of the writing region of the dummy substrate 300 and written without correction. Concretely, $(X_E'', Y_E'')$ are obtained by calculating the equations (12-1) and (12-2) by using the correction parameters of the equations (12-1) and (12-2), namely $a''$, $b_1''$, $b_2''$, ..., $d_3''$, $d_4''$, $p''$, $q_1''$, $q_2''$, ..., $s_3''$ and $s_4''$. This enables to correct both the global position error and the position error resulting from distortion of the electron optical system, with respect to the center position $(X_{0C}, Y_{0C})$ of the SF. Then, the main deflection operating unit 114 outputs a digital deflection amount for deflecting the beam to the calculated center position $(X_E'', Y_E'')$ of the SF after the correction, to the DAC 124. It is preferable to obtain correction parameters of the equations (12-1) and (12-2) so that the center position $(X_E'', Y_E'')$ may become the digital deflection amount to be output to the DAC 124. That is, it is preferable to treat $X_E''$ and $Y_E''$ as input values to the DAC/AMP for deflection.

In the step S306, as a D/A (digital analog) conversion step, the DAC 124 converts the digital deflection amount for deflecting the beam to the calculated center position $(X_E'', Y_E'')$ of the SF into an analog deflection amount.

In the step S402, as a sub deflection position correcting operation step, the sub deflection operating unit 112 inputs data converted from the writing data, and corrects a relative distance $(x_0, y_0)$ from the center position $(X_{1C}, Y_{1C})$ of the SF, being a corrected reference position, to an arbitrary position in the SF, based on writing data. The sub deflection operating unit 112 serves as an example of a second correction unit. The relative distance $(x_0, y_0)$ is corrected using the center position $(X_{0C}, Y_{0C})$, and the coefficients of the correction equations (2-1) and (2-2) for correcting the center position $(X_{0C}, Y_{0C})$ of the SF, based on a pattern distortion of the dummy substrate 300. Concretely, ($X_E$, $Y_E$) is obtained by calculating the equations (11-1) and (11-2) by using the set correction parameters of the equations (11-1) and (11-2), namely a', $b_1'$, $b_2'$, ..., $d_3'$, $d_4'$, p', $q_1'$, $q_2'$, ..., $s_3'$, and $s_4'$. This enables to correct both the global position error and the position error resulting from distortion of the electron optical system, with respect to the relative distance ($x_0$, $y_0$) from the center of the SF to an arbitrary position in the SF. The sub deflection operating unit 112 outputs a digital deflection amount for deflecting the beam to the calculated relative distance ($X_E$, $Y_E$) after the correction, to the DAC 122. It is preferable to obtain correction parameters of the equations (11-1) and (11-2) so that the relative distance ($X_E$, $Y_E$) may become the digital deflection amount to be output to the DAC 122. That is, it is preferable to treat $X_E$ and $Y_E$ as input values to the DAC/AMP for deflection.

In the step S406, as a D/A (digital analog) conversion step, the DAC 122 converts the digital deflection amount for deflecting the beam to the calculated relative distance ($X_E$/$Y_E$) into an analog deflection amount.

In the step S502, as a writing step, the writing unit 150 deflects the electron beam 200 based on the analog deflection amount for each deflector, and writes a predetermined pattern on the target workpiece 101. The analog deflection amount converted by the DAC 124 is amplified by the amplifier 134, and applied to the main deflector 214 as a main deflection voltage. The main deflector 214 deflects the electron beam 200 to the corrected reference position of the SF, by the electrostatic action caused by the deflection voltage. Thereby, the reference position of the SF is determined. In this case, the center position ($X_E''$, $Y_E''$) is the reference position of the SF. The analog deflection amount converted by the DAC 122 is amplified by the amplifier 132, and applied to the sub deflector 212 as a sub voltage. The sub deflector 212 deflects the electron beam 200 to the position which is further away from the position deflected by the main deflector 214 by the relative distance after the correction, by the electrostatic action caused by the deflection voltage. Thereby, a desired figure can be written. In this case, the relative distance ($X_E$, $Y_E$) is a relative distance from the reference position of the SF to an arbitrary position in the SF.

Figure 5A:
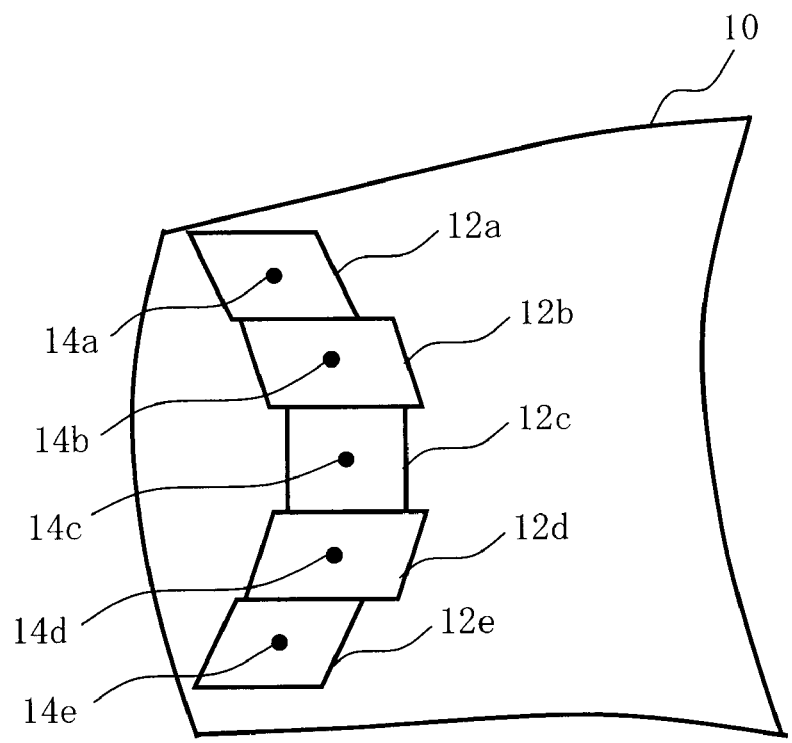
FIGS. 5A and 5B show schematic diagrams for explaining an SF correction for a global position error according to Embodiment 1.
Figure 5B:
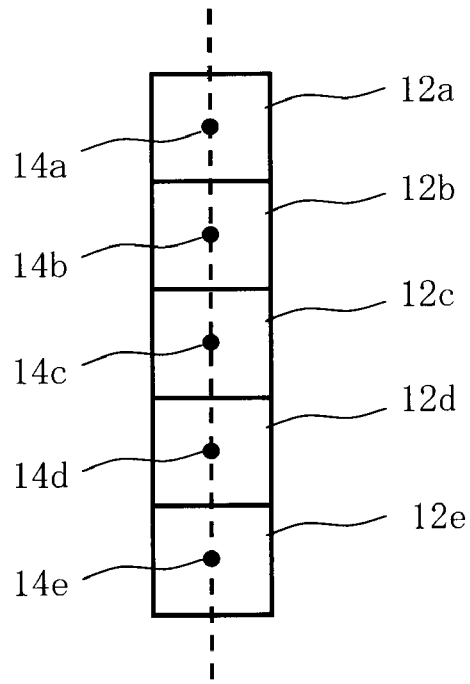
Figure 6:
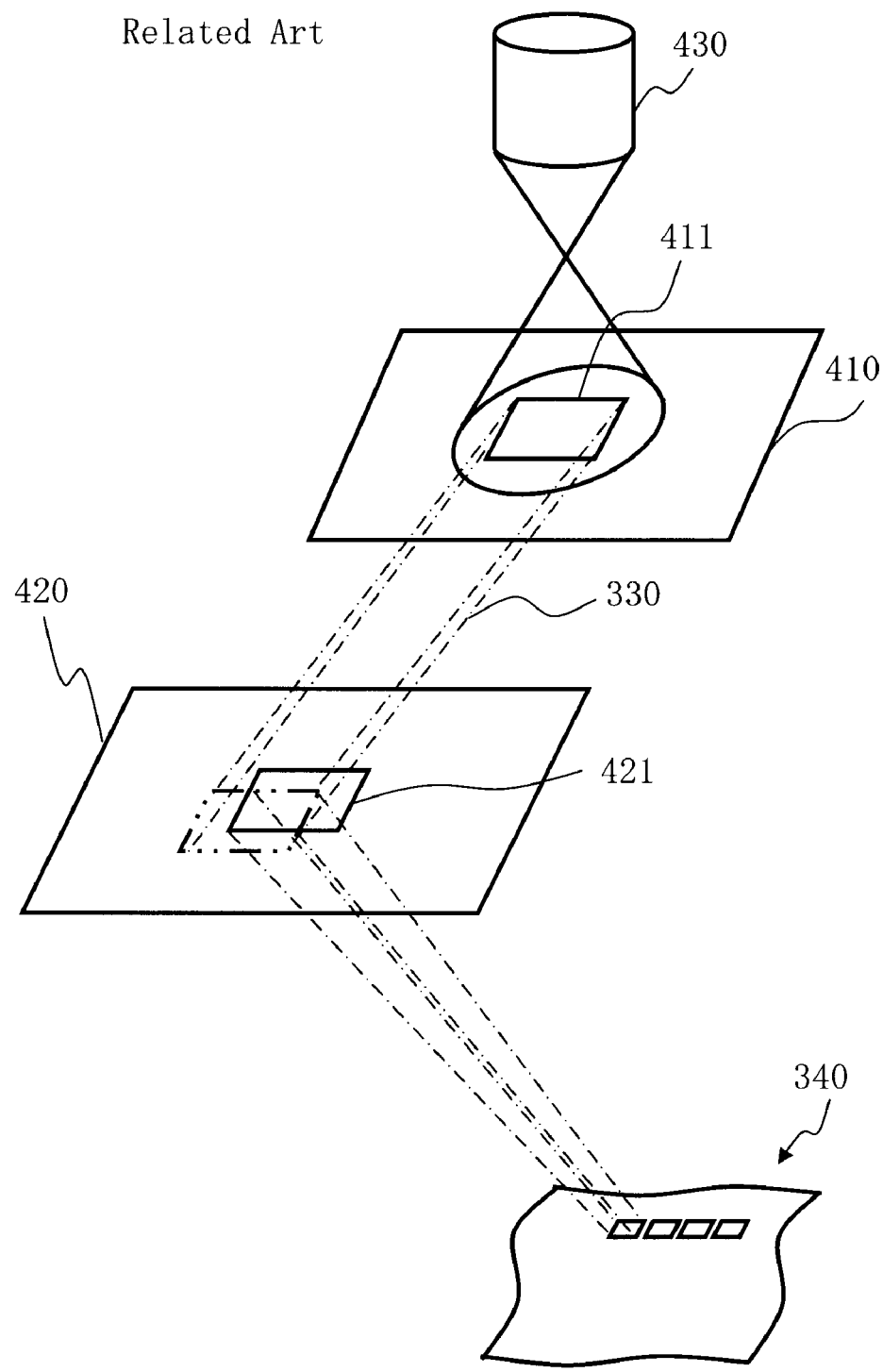
FIG. 6 shows a schematic diagram for describing operations of a variable-shaped type electron beam writing apparatus.
Figure 7A:
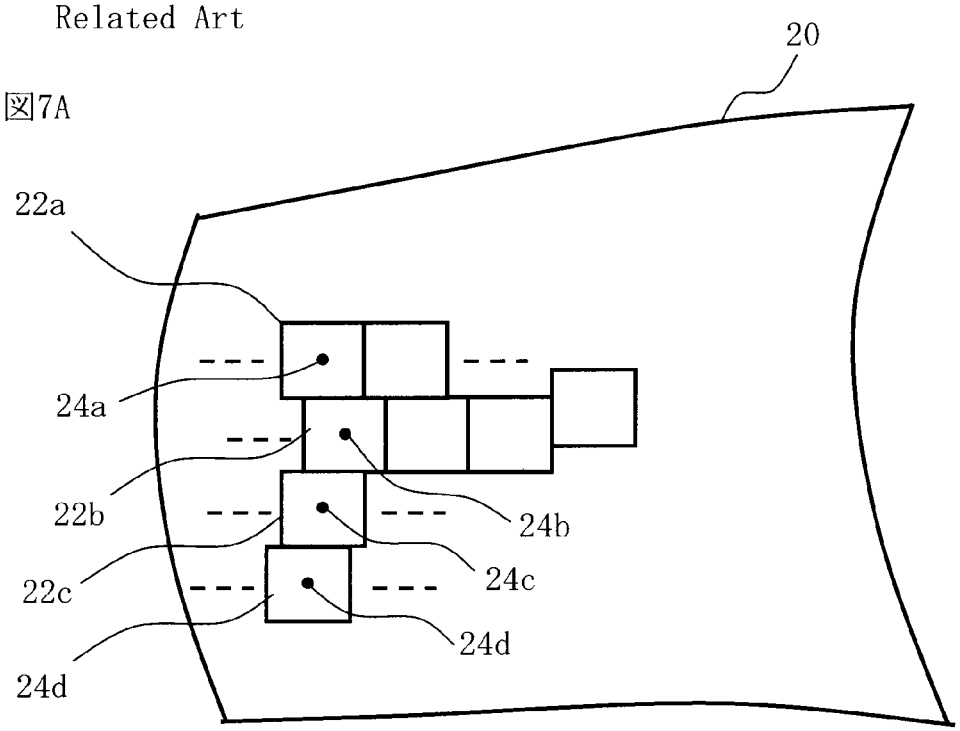
FIGS. 7A and 7B show schematic diagrams for explaining a conventional distortion correction.
Figure 7B:
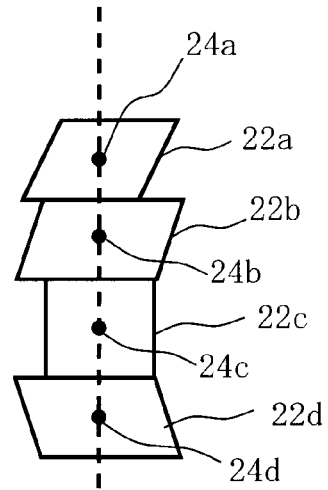

FIGS. 5A and 5B show schematic diagrams for explaining an SF correction for a global position error described in Embodiment 1. As shown in FIG. 5A, when distortion or flexure occurs in the pattern 10, first the position of a center 14 of an SF 12 in the pattern 10 is corrected so that it may be located on a straight line after writing, as shown in FIG. 5B, by the main deflection position correction mentioned above. Then, the distortion of the SF 22 itself is corrected to be a square or rectangle having no distortion after writing as shown in FIG. 5B, by the sub deflection position correction. By correcting not only the coordinates (reference position) of the center 14 of each SF 12 but also an arbitrary position coordinate of each SF 12 as described in this Embodiment, it is possible to eliminate or reduce even an error resulting from a distortion or flexure in the SF as shown in FIG. 5B. In this case, in order to correct the pattern 10 convexly distorted on the left-hand side, the SF 12a to SF 12e are corrected to be convex on the right-hand side, thereby it is possible to locate the SF 12a to the SF 12e at the positions having no distortion, after writing as shown in FIG. 5B. This enables to perform a correction sufficiently precisely.

As mentioned above, in sub deflection, the sub deflection operating unit 112 corrects the relative distance by using coefficients obtained by combining the coefficients of the correction equations (7-1) and (7-2) for correcting a relative distance based on a pattern distortion of the dummy target workpiece 300 and the coefficients of the correction equations (9-1) and (9-2) for correcting an error of the relative distance resulting from the optical system of the electron beam 200. This enables to correct both the global position error and the position error resulting from distortion of the electron optical system.

In other words, by correcting a relative distance which is from a corrected reference position to an arbitrary position in a small region by using coefficients of correction equations for correcting a reference position based on a pattern distortion of the dummy target workpiece 300 and using the reference position, it is possible to write not only at the reference position of a small region but also at a position where a global position error in the small region is eliminated or reduced. Therefore, the global position error can be corrected in a high precision. As a result, this enables to write at a highly precise position.

In the above description, what is represented as the "unit" or "step" can be configured by computer programs. They may be implemented by software programs executed by the computer system. Alternatively, they may be executed by a combination of software and hardware, or a combination of software, hardware and/or firmware. When constituted by a program, the program is stored in a computer-readable recording medium, such as a magnetic disk drive, magnetic tape drive, FD, CD, DVD, MO or ROM.

While the embodiments have been described above with reference to specific examples, the present invention is not restricted to these specific ones. In the description mentioned above, although it is structured a distortion correction of the electron optical system is performed simultaneously with a global position correction, it is not limited thereto. To provide steps or functions for performing the correction separately is also acceptable. For example, it is preferable, after performing a global position correction, to correct a distortion of the electron optical system, with respect to the position after the correction, or alternatively, it is also preferable to execute in reverse order. Alternatively, although less precise, the case of performing only a global position correction without correcting a distortion of the electron optical system may be acceptable. In these cases, what is necessary is to set the equations (7-1) and (7-2), and the correction parameters of the equations (7-1) and (7-2), namely A', $B_1'$, $B_2'$, $C_1'$, $C_2'$, $C_3'$, $D_1'$, $D_2'$, $D_3'$, $D_4'$, P', $Q_1'$, $Q_2'$, $R_1'$, $R_2'$, $R_3'$, $S_1'$, $S_2'$, $S_3'$ and $S_4'$, to the sub deflection operating unit 112. Similarly, what is necessary is to set the equations (2-1) and (2-2), and correction parameters of the equations (2-1) and (2-2), namely A, $B_1$, $B_2$, $C_1$, $C_2$, $C_3$, $D_1$, $D_2$, $D_3$, $D_4$, P, $Q_1$, $Q_2$, $R_1$, $R_2$, $R_3$, $S_1$, $S_2$, $S_3$ and $S_4$ to the main deflection operating unit 114.

While description of the apparatus structure, control method, etc. not directly required for explaining the present invention is omitted, it is possible to suitably select and use some or all of them when needed. For example, although the structure of the control unit for controlling the pattern writing apparatus 100 is not described, it should be understood that a necessary control unit structure can be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A charged particle beam writing apparatus comprising:
   an emitting unit configured to emit a charged particle beam;
   a stage on which a target workpiece to be written is placed;
   a first correction unit configured to correct a reference position of a small region in a writing region of the target workpiece to be written, by performing a calculation using a coefficient obtained by combining a coefficient of a correction equation for correcting position errors of the small region induced by an optical system for the charged particle beam and a coefficient of a correction equation for correcting global position errors in the whole writing region, and a value of the reference position of the small region in target workpiece coordinates, wherein the correction equation for correcting global position errors is based on a pattern distortion obtained from positions of a plurality of figures spread over substantially all of the writing region of a dummy target workpiece and written without correcting, wherein the position errors of the small region induced by the optical system include distortion of the reference position of the small region induced by the optical system;
   a first deflector configured to deflect the charged particle beam, to a corrected reference position obtained by correcting the reference position;
   a second correction unit configured to correct a relative distance from the corrected reference position to an arbitrary position in the small region, by performing a calculation using a coefficient obtained by combining a coefficient of a correction equation for correcting position errors induced by an optical system in the small region and the coefficient of the correction equation for correcting global position errors in the whole writing region, and the value of the reference position of the small region in the target workpiece coordinates, wherein the position errors induced by the optical system in the small region include distortion of the arbitrary position induced by the optical system; and
   a second deflector configured to further deflect the charged particle beam from a position deflected by the first deflector, based on the relative distance corrected.

2. The apparatus according to claim 1 further comprising:
   a mirror, arranged on the stage to be equal to or longer than a size of the writing region with respect to along the target workpiece, configured to reflect a laser light; and
   a measuring unit configured to emit the laser light, receive the laser light reflected from the mirror, and measure a position of the stage, based on the laser light received.

3. A charged particle beam writing method for writing a predetermined pattern on a target workpiece by deflecting a charged particle beam by using a main deflector and a sub deflector comprising:
   correcting a reference position of a small region, to be deflected by the main deflector, in a writing region of the target workpiece to be written, by performing a calculation using a coefficient obtained by combining a coefficient of a correction equation for correcting position errors of the small region induced by an optical system for the charged particle beam and a coefficient of a correction equation for correcting global position errors in the whole writing region, and a value of the reference position of the small region in target workpiece coordinates, wherein the correction equation for correcting global position errors is based on a pattern distortion obtained from positions of a plurality of figures spread over substantially all writing region of a dummy target workpiece and written without correcting, and wherein the position errors of the small region induced by the optical system include distortion of the relative position of the small region induced by the optical system; and
   correcting a relative distance, to be deflected by the sub deflector, from a corrected reference position obtained by correcting the reference position to an arbitrary position in the small region, by performing a calculation using a coefficient obtained by combining a coefficient of a correction equation for correcting position errors induced by an optical system in the small region and the coefficient of the correction equation for correcting global position errors in the whole writing region, and the value of the reference position of the small region in the target workpiece coordinates, wherein the position errors induced by the optical system in the small region include distortion of the arbitrary position induced by the optical system.

4. The method according to claim 3 further comprising:
   deflecting the charged particle beam, based on the corrected reference position obtained by correcting the reference position, by using the main deflector; and
   further deflecting the charged particle beam, from a position deflected by the main deflector, based on the relative distance corrected, by using the sub deflector.

* * * * *